(12) United States Patent
Zhou et al.

(10) Patent No.: US 10,459,153 B2
(45) Date of Patent: Oct. 29, 2019

(54) LIGHT GUIDE PLATE AND FABRICATING METHOD THEREOF, ARRAY SUBSTRATE AND FABRICATING METHOD THEREOF, AND DISPLAY DEVICE

(71) Applicant: BOE TECHNOLOGY GROUP CO., LTD., Beijing (CN)

(72) Inventors: Shanshan Zhou, Beijing (CN); Yoon-Sung Um, Beijing (CN); Yuting Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 123 days.

(21) Appl. No.: 15/227,444

(22) Filed: Aug. 3, 2016

(65) Prior Publication Data

US 2017/0192155 A1 Jul. 6, 2017
US 2018/0017730 A9 Jan. 18, 2018

(30) Foreign Application Priority Data

Jan. 5, 2016 (CN) .......................... 2016 1 0006126

(51) Int. Cl.
*F21V 8/00* (2006.01)
*G02F 1/1345* (2006.01)
(Continued)

(52) U.S. Cl.
CPC ......... *G02B 6/0061* (2013.01); *G02B 6/0043* (2013.01); *G02B 6/0065* (2013.01);
(Continued)

(58) Field of Classification Search
CPC .. G02B 6/0061; G02B 6/0043; G02B 6/0065; H01L 27/124; G02F 1/13454; G02F 1/134336
(Continued)

(56) References Cited

U.S. PATENT DOCUMENTS

2009/0096957 A1\* 4/2009 Hiyama ................. G02B 6/003
349/65
2011/0096567 A1\* 4/2011 Tiao ..................... G02B 6/0043
362/607
(Continued)

FOREIGN PATENT DOCUMENTS

CN 2798233 Y 7/2006
CN 102537754 A 7/2012
(Continued)

OTHER PUBLICATIONS

China First Office Action, Application No. 201610006126.9, dated Jun. 28, 2018, 20 pps.: with English translation.
(Continued)

*Primary Examiner* — Charles S Chang
(74) *Attorney, Agent, or Firm* — Armstrong Teasdale LLP

(57) ABSTRACT

The present disclosure relates to a light guide plate and a fabricating method thereof, an array substrate and a fabricating method thereof, and a display device. In the light guide plate provided in the present disclosure, in a region corresponding to a first display region for arranging a gate driven circuit, more net-dots are provided or the diameter of net-dots is set to be larger, such that the luminance of outgoing light from the light guide plate in this region can be increased, thereby weakening the luminance difference between the corresponding display region and other display region.

18 Claims, 3 Drawing Sheets

(51) Int. Cl.
*H01L 27/12* (2006.01)
*G02F 1/1343* (2006.01)
(52) U.S. Cl.
CPC .... *G02F 1/13454* (2013.01); *G02F 1/134336* (2013.01); *H01L 27/124* (2013.01)
(58) Field of Classification Search
USPC .......................................................... 349/62
See application file for complete search history.

(56) References Cited

U.S. PATENT DOCUMENTS

| | | | | |
|---|---|---|---|---|
| 2014/0218971 A1* | 8/2014 | Wu | ..................... | F21V 33/0052 |
| | | | | 362/613 |
| 2015/0316699 A1* | 11/2015 | Shimizu | ............... | G02B 6/0043 |
| | | | | 348/790 |
| 2017/0169779 A1* | 6/2017 | Song | .................. | G02F 1/133512 |
| 2017/0261828 A1* | 9/2017 | Noma | ................... | G02F 1/1368 |

FOREIGN PATENT DOCUMENTS

| | | |
|---|---|---|
| CN | 103543487 A | 1/2014 |
| CN | 103971600 A | 8/2014 |
| TW | 201115191 A | 5/2011 |

OTHER PUBLICATIONS

China Second Office Action, Application No. 201610006126.9, dated Mar. 26, 2019, 28 pps.: with English translation.

\* cited by examiner

LIGHT GUIDE PLATE AND FABRICATING METHOD THEREOF, ARRAY SUBSTRATE AND FABRICATING METHOD THEREOF, AND DISPLAY DEVICE

CROSS REFERENCE TO RELATED APPLICATIONS

This application claims the benefit and priority of Chinese Patent Application No. 201610006126.9, filed on Jan. 5, 2016. The entire disclosure of the above application is incorporated herein by reference.

BACKGROUND

The present disclosure relates to the field of display technology, and particularly, to a light guide plate and a fabricating method thereof, an array substrate and a fabricating method thereof, and a display device.

GIA (Gate driver In Array, i.e. a gate driving circuit fabricated in an array substrate) may implement a narrow frame design of a display panel, but since wiring is conducted inside pixel in such an array substrate, the pixel aperture ratio is reduced, thereby reducing pixel transmissivity. This structural configuration makes the luminance of a display region on the array substrate for arranging the gate driven circuit decrease, thus forming bright streaks at a junction region between the display region and a peripheral display region.

BRIEF DESCRIPTION

The embodiments described herein provide a light guide plate and a fabricating method thereof, an array substrate and a fabricating method thereof, and a display device, which can remove bright streaks at a junction region between a display region for arranging a gate driving circuit and a peripheral display region.

In a first aspect, embodiments of the present disclosure provide a light guide plate for use in a liquid crystal display device, the liquid crystal display device comprising an array substrate with a gate driven circuit being fabricated in a pixel unit, the light guide plate comprising a light guide plate body and a plurality of net-dots (also may be called light guide dots or light outgoing dots) disposed on the light guide plate body, wherein the density of net-dots in a first region of the light guide plate body is greater than the density of net-dots in a second region of the light guide plate body; and/or, the diameter of net-dots in the first region of the light guide plate body is greater than the diameter of net-dots in the second region of the light guide plate body, wherein the first region corresponds to a first display region of the array substrate, the second region corresponds to a second display region of the array substrate, the first display region is a region where the gate driven circuit is fabricated in the pixel unit, and the second display region is the region other than the first display region.

In one example, the second region comprises a first sub-region and a second sub-region, the second sub-region is located between the first sub-region and the first region, and the density of net-dots within the second sub-region of the light guide plate body is less than the density of net-dots within the first sub-region of the light guide plate body; and/or, the diameter of net-dots within the second sub-region of the light guide plate body is less than the diameter of net-dots within the first sub-region of the light guide plate body.

In one example, the density of net-dots within the second sub-region of the light guide plate body is gradually increased from the first region to the first sub-region; and/or, the diameter of net-dots within the second sub-region of the light guide plate body is gradually increased from the first region to the first sub-region.

In one example, the diameter of net-dots within the second region of the light guide plate body is between 25-35 μm; the diameter of net-dots within the first region of the light guide plate body is between 30-50 μm.

In a second aspect, embodiments of the present disclosure provide an array substrate. A gate driven circuit is provided in a pixel unit on the array substrate. The array substrate comprises a first display region and a second display region, wherein the first display region is a region where the gate driven circuit is fabricated in the pixel unit, and the second display region is a region other than the first display region; the second display region comprises a first display sub-region and a second display sub-region, and the second display sub-region is located between the first display sub-region and the first display region, and the area of a pixel electrode within the second display sub-region is less than the area of a pixel electrode within the first display sub-region.

In one example, the area of the pixel electrodes within the second display sub-region is gradually increased from the first display region to the first display sub-region.

In one example, the length of the first display region in a row direction is 0.8-1.2 mm.

In one example, the length of the first display region in the row direction is 0.95-1.05 mm.

In a third aspect, embodiments of the present disclosure provide a fabricating method of a light guide plate for use in a liquid crystal display device, the liquid crystal display device comprising an array substrate with a gate driven circuit being fabricated in a pixel unit, the method comprising:

providing a light guide plate body;

forming a plurality of net-dots on the light guide plate body, so that the density of net-dots in a first region of the light guide plate body is greater than the density of net-dots in a second region of the light guide plate body; and/or, the diameter of net-dots in the first region of the light guide plate body is greater than the diameter of net-dots in the second region of the light guide plate body, wherein the first region corresponds to a first display region of the array substrate, the second region corresponds to a second display region of the array substrate, the first display region is a region where the gate driven circuit is fabricated in the pixel unit, and the second display region is the region other than the first display region.

In a fourth aspect, embodiments of the present disclosure provide a fabricating method of an array substrate described herein, comprising a step of forming a gate driven circuit in a pixel unit of a first display region and a step of forming a pixel electrode.

In a fifth aspect, embodiments of the present disclosure provide a liquid crystal display device, comprising a light guide plate described herein and an array substrate described herein.

In one example, the second region comprises a first sub-region and a second sub-region, the second sub-region is located between the first sub-region and the first region, and the density of net-dots within the second sub-region of the light guide plate body is less than the density of net-dots within the first sub-region of the light guide plate body; and/or, the diameter of net-dots within the second sub-region of the light guide plate body is less than the diameter of net-dots within the first sub-region of the light guide plate body.

In one example, the density of net-dots within the second sub-region of the light guide plate body is gradually increased from the first region to the first sub-region; and/or, the diameter of net-dots within the second sub-region of the light guide plate body is gradually increased from the first region to the first sub-region.

In one example, the diameter of net-dots within the second region of the light guide plate body is between 25-35 µm; the diameter of net-dots within the first region of the light guide plate body is between 30-50 µm.

In one example, the area of the pixel electrodes within the second display sub-region is gradually increased from the first display region to the first display sub-region.

In one example, the length of the first display region in a row direction is 0.8-1.2 mm.

In one example, the length of the first display region in the row direction is 0.95-1.05 mm.

In the light guide plate provided by the embodiments described herein, in the region corresponding to the first display region for arranging the gate driven circuit, more net-dots are provided or the diameter of net-dots in this region is set larger, so as to be able to enable the luminance of outgoing light of the light guide plate in this region to increase, thereby weakening the luminance difference between the first display region and other regions, and further weakening the above-described luminance difference line. And in this way, the display luminance of the respective display device can be enabled to be more uniform.

In the array substrate provided by the embodiments described herein, the second display region other than the first display region is divided into a first display sub-region and a second display sub-region; and the area of the pixel electrodes within the second display sub-region located between the first display sub-region and the first display region is designed less than the area of the first display sub-region. Thus, the display luminance of the second display sub-region is less than the area of the first display sub-region, so that the display luminance of the second display sub-region in the second display region is between the display luminance of the first display region and the display luminance of the first display sub-region in the second display region, whereby it can weaken the luminance difference line to some extent.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

Drawings described herein are intended for purposes of illustration of the selected embodiments only and are not all possible embodiments, and are not intended to limit the scope of the application, in which.

Corresponding reference numerals indicate corresponding parts or features throughout the several views of the drawings.

DETAILED DESCRIPTION

To more clearly understand the present disclosure, the present disclosure will be described below in further detail in conjunction with the accompanying drawings and the specific embodiments. It should be noted that, in the absence of conflict, embodiments of the present application and features in the embodiments may be combined with each other.

Embodiment 1

Figure 1:
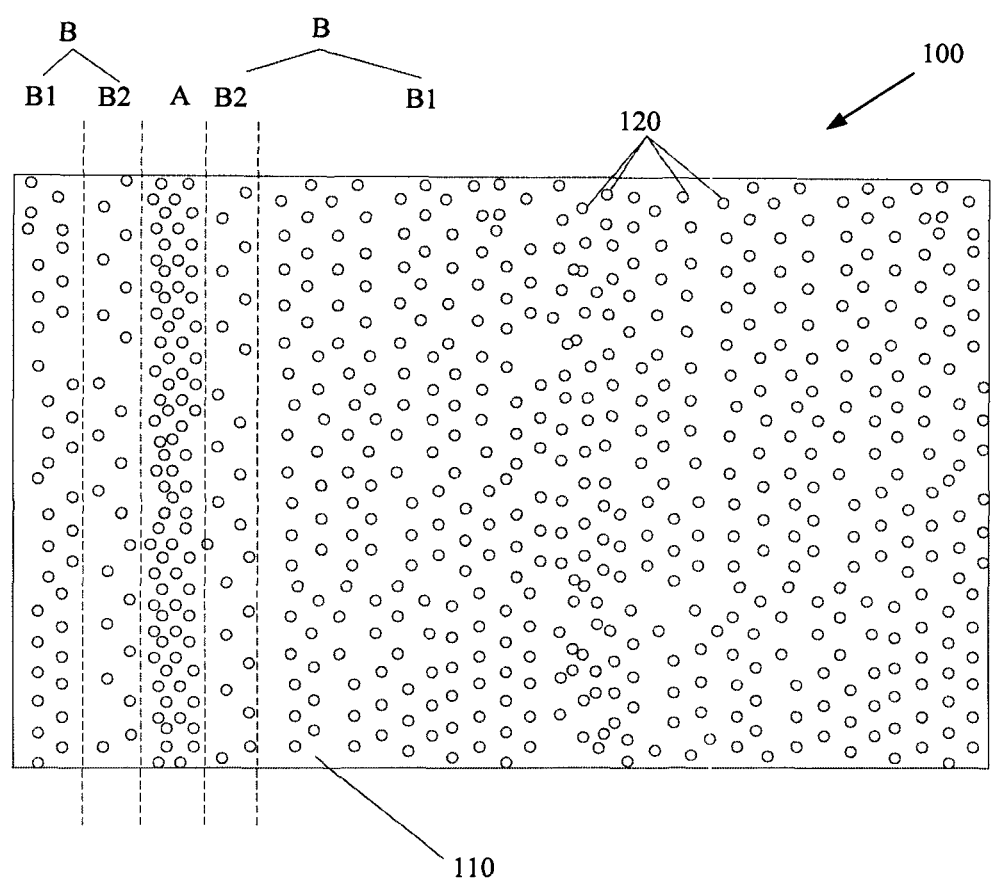
FIG. 1 is a schematic view of the structure of a light guide plate provided in a first embodiment.
Figure 3:
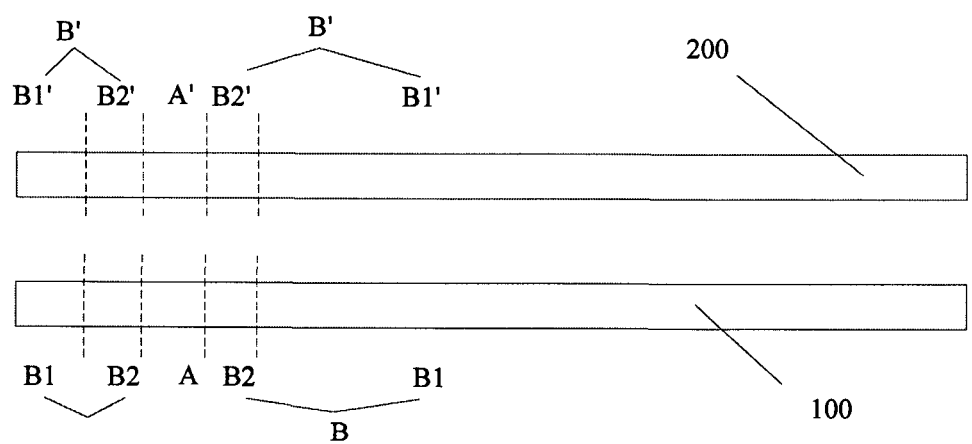
FIG. 3 is a schematic view of part of the structure of an exemplary liquid crystal display device.

Embodiment 1 of the present disclosure provides a light guide plate. As shown in FIG. 1 and FIG. 3, a plurality of net-dots 120 are provided on a light guide plate body 110 of the guide plate 100, wherein the density of net-dots 120 in a first region A of the light guide plate body 110 is greater than the density of net-dots 120 in a second region B of the light guide plate body 110.

"a first region A" described herein is a region corresponding to a first display region A' of an array substrate 200 when the light guide plate body 110 is applied to a display device, and "a first display region A'" described herein is a region where a gate driven circuit is fabricated in a pixel unit on the array substrate; "a second region B" described herein is the region other than the first region A, and "a second display region B'" described herein is the region other than the first display region A'.

In the present embodiment, since the density of net-dots 120 in the first region A is greater than the density of net-dots 120 in the second region B, the light guiding capability of the light guide plate 110 in the first region A is stronger, so that more light is incident on the first display region A' of the array substrate 200, whereby it is possible to enhance the display luminance of the first display region A', reduce the difference between the display luminance of the first display region A' and the display luminance of the second display region B', and weaken the luminance difference line.

In specific applications, the present disclosure does not define specific values of the density of net-dots 120 within the first region A and of the density of net-dots in the second region B. According to the description of embodiments of the present disclosure, those skilled in the art may reasonably design the density of net-dots in the first region A and the density of net-dots within the second region B, so that the display luminance of the first display region A' and of the second display region B' are more uniform.

Referring to FIG. 1, in an alternative embodiment, the second region B above-described can also be divided into a first sub-region B1 and a second sub-region B2, wherein the second sub-region B2 is located between the first sub-region B1 and the first region A, adjacent to the first region A and the first sub-region B1. The density of net-dots in the second sub-region B2 is less than the density of net-dots in the first sub-region B1. Such configuration enables outgoing light from the second sub-region B2 of the light guide plate to be less than outgoing light from the first sub-region B1 of the light guide plate, such that the display luminance of the second display sub-region B2' in the second display region B' corresponding to the second sub-region B2 be lower than the display luminance of the first display sub-region B1' corresponding to the first sub-region B1. Because the gate driven circuit is provided in the first display region A', the display luminance of this region is reduced, and therefore by appropriately decreasing the display luminance of the second display sub-region B2', it is possible to make the display luminance of the second display sub-region B2' be between the display luminance of the first display region A' and the display luminance of the first display sub-region B1', to form a transition zone of luminance, so as to make the display luminance more uniform. Of course, in specific applications, in other embodiments, the density of net-dots of the second region B is not necessarily disposed in this manner, and the corresponding technical solutions can also achieve the basic purpose of the present application and should also fall within the scope of the present application accordingly.

On the basis of Embodiment I above-described, as an alternative embodiment, the density of net-dots within the second sub-region B2 may be gradually increased from the first region A to the first sub-region B1, so that the luminance of the second display sub-region B2' can be gradually increased from the first display region A' to the first display sub-region B1', to further reduce the luminance difference.

Embodiment II

Figure 2:
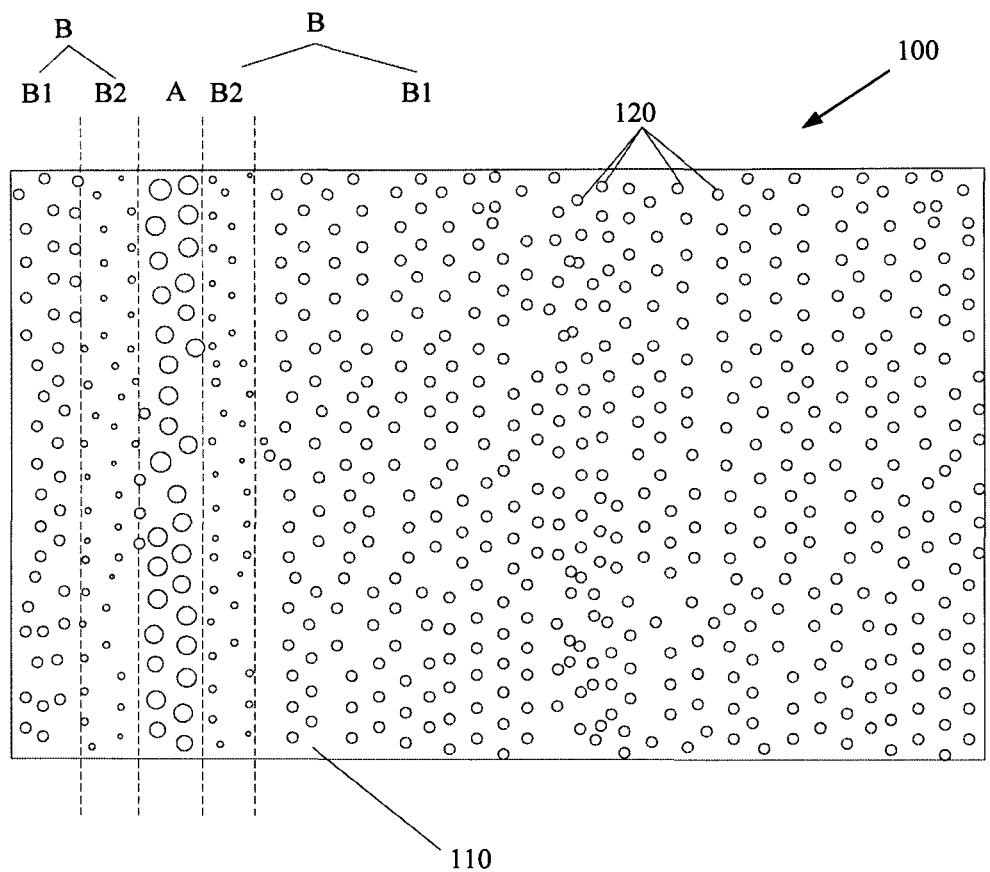
FIG. 2 is a schematic view of the structure of a light guide plate provided in a second embodiment.

Embodiment II of the present disclosure provides a light guide plate. As shown in FIG. 2 and FIG. 3, a plurality of net-dots 120 are provided on a light guide plate body 110 of the guide plate 100, wherein the diameter of net-dots 120 in a first region A of the light guide plate body 110 is greater than the diameter of net-dots 120 in a second region B of the light guide plate body 110.

"a first region A" described herein is a region corresponding to a first display region A' of an array substrate 200 when the light guide plate body 110 is applied to a display device, and "a first display region A'" described herein is a region where a gate driven circuit is fabricated in a pixel unit on the array substrate 200; "a second region B" described herein is the region other than the first region A, corresponding to the second display region B', and "a second display region B'" described herein is the region other than the first display region A'.

In the present embodiment, since the diameter of net-dots 120 in the first region A is greater than the density of net-dots 120 in the second region B, the light guiding capability of the light guide plate 110 in the first region A is stronger, so that more light is incident on the first display region A' of the array substrate 200, whereby it is possible to enhance the display luminance of the first display region A', reduce the difference between the display luminance of the first display region A' and the display luminance of the second display region B', and weaken the luminance difference line.

In specific applications, in the present embodiment, the diameter of net-dots of the second region B may be 25-35 µm, and the diameter of net-dots of the first region A is 30-50 µm.

Referring to FIG. 2, in an alternative embodiment, the second region B above-described can also be divided into a first sub-region B1 and a second sub-region B2, wherein the second sub-region B2 is located between the first sub-region B1 and the first region A, adjacent to the first region A and the first sub-region B1. The diameter of net-dots in the second sub-region B2 is less than the diameter of net-dots in the first sub-region B1. Such configuration enables outgoing light from the second sub-region B2 of the light guide plate to be less than outgoing light from the first sub-region B1 of the light guide plate, such that the display luminance of the second display sub-region B2' in the second display region B' corresponding to the second sub-region B2 be lower than the display luminance of the first display sub-region B1' corresponding to the first sub-region B1. In the present embodiment, by appropriately decreasing the display luminance of the second display sub-region B2', it is possible to make the display luminance of the second display sub-region B2' be between the display luminance of the first display region A' and the display luminance of the first display sub-region B1', to form a transition zone of luminance, so as to make the display luminance more uniform. Of course, in specific applications, in some other embodiments, the diameter of net-dots of the second region B is not necessarily disposed in this manner, and the corresponding technical solutions can also achieve the basic purpose of the present application and should also fall within the scope of the present application accordingly.

On the basis of Embodiment II above-described, as an alternative embodiment, the diameter of net-dots within the second sub-region B2 may be gradually increased from the first region A to the first sub-region B1, so that the luminance of the second display sub-region B2' can be gradually increased from the first display region A' to the first display sub-region B1', to further reduce the luminance difference and weaken the luminance difference line.

Specifically, when the second region B above-described comprises a first sub-region B1 and a second sub-region B2 in accordance with the above-described alternative manner, the diameter of net-dots within the second sub-region B2 may be gradually increased in the direction of the first region A toward the first sub-region B1 from 30-35 µm to 45-50 µm until to be consistent with the diameter of net-dots within the first sub-region B1.

It should be noted that in the embodiments described herein, the first region A corresponds to the first display region A', but it does not mean that the location, area and contour of the first region A is completely identical with the location, area and contour of the first display region A'. In actual practice, due to the divergence of light, the area of the first display region A' can be slightly larger than the area of the first region A. Similarly, it is also true for the relationship between the first sub-region B1 and the first display sub-region B1'.

Embodiment III

Figure 4:
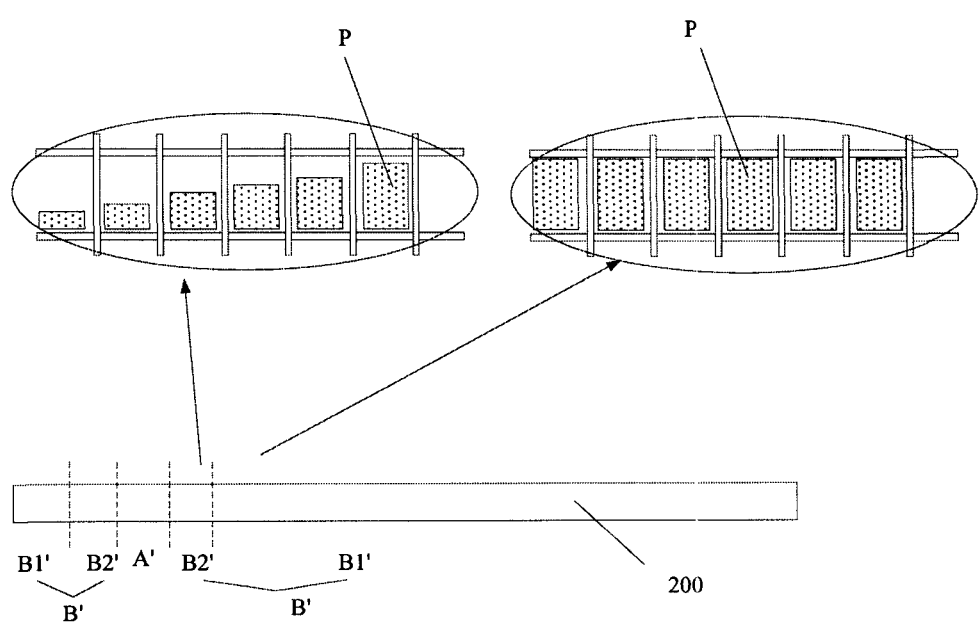
FIG. 4 is a schematic view of the structure of an array substrate provided in a third embodiment.

Embodiment III of the present disclosure provides an array substrate. In this embodiment, the array substrate is a GIA array substrate. Referring to FIG. 4, the array substrate may include a first display region A' and a second display region B', wherein the second display region B' may include a first display sub-region B1' and a second display sub-region B2'. The length of a pixel electrode P within the second display sub-region B2' in the column direction is less than the length of a pixel electrode P within the first display sub-region B1' in the column direction, and the length of the pixel electrode P within the second display sub-region B2' in the row direction is the same as the length of the pixel electrode P within the first display sub-region B1' in the row direction. In the present embodiment, the first display region A' is a region where a gate driven circuit is fabricated in a pixel unit; the second display region B' is a region other than the first display region A', and the second display sub-region B2' is located between the first display sub-region B1' and the first display region A'.

Such configuration manner makes the area of the pixel electrode of the second display sub-region B2' to be less than the area of the pixel electrode P of the first display sub-region B1'. This can make the display luminance of the second display sub-region B2' lower than the display luminance of the first display sub-region B1', so that the display luminance of the second display sub-region B2' is between the first display region A' and the first display sub-region B1', to form a transition zone of luminance and weaken the luminance difference line.

In an alternative embodiment of the present disclosure, the length of the pixel electrodes P within the second display sub-region B2' in the column direction is gradually increased from the first display region A' toward the first display sub-region B1'.

This can make the area of the pixel electrodes P of the second display sub-region B2' be gradually increased from the first display region A' to the first display sub-region B1', thereby making the display luminance of the second display sub-region B2' be gradually increased from the first a display region A' toward the first display sub-region B1', to further reduce the luminance difference and weaken the luminance difference line. Of course, in terms of the meeting of the basic purposes of the present disclosure, the embodiments are not necessarily performed in this way.

It is not difficult to understand that, although in the embodiments described herein, the areas of different pixel electrodes are made different in such a manner that the length of the pixel electrodes is different in the column direction but the same in the row direction, whereas in practical applications, in some other alternative embodiments, it also may be specified that the length of the pixel electrodes may be the same in the column direction but different in the row direction; or the area of the pixel electrodes may be made different in another manner. As long as the area of a pixel electrode within the first display sub-region B2' is less than the area of a pixel electrode within the first display sub-region B1', the luminance difference line can be weakened to a certain extent; and as long as the area of the pixel electrodes within the first display sub-region B1' is gradually increased from the first display region A' to the first display sub-region B1', an effect of the luminance difference line being further weakened can be achieved, and the corresponding embodiments should fall within the scope of protection of the present disclosure.

In any of the above-described embodiments, the length of the first display region A1 in the row direction may be between 0.8-1.2 mm. Further, the length of the first display region in the row direction may be between 0.95-1.05 mm, and may specifically be 1 mm.

In another aspect of the present disclosure, there is further provided a fabricating method of a light guide plate, which can be used to fabricate the light guide plate according to any of the above-described embodiments. The light guide plate fabricated is for use in a liquid crystal display device, the liquid crystal display device comprising an array substrate with a gate driven circuit fabricated in a pixel unit. The fabricating method comprises the steps of:

providing a light guide plate body;

forming a plurality of net-dots on the light guide plate body, wherein the density of net-dots in a first region of the light guide plate body is greater than the density of net-dots in a second region of the light guide plate body; and/or, the diameter of net-dots in the first region of the light guide plate body is greater than the diameter of net-dots in the second region of the light guide plate body, wherein the first region corresponds to a first display region of the array substrate, the second region corresponds to a second display region of the array substrate, the first display region is a region where the gate driven circuit is fabricated in the pixel unit, and the second display region is the region other than the first display region.

Specifically how to form net-dots on the light guide plate body may be understood with reference to the prior art, and in that respect the embodiments of the present disclosure are not described in detail herein.

When the above-described method is used for fabricating the light guide plate in various embodiments described herein, many different forms may be performed, and will not be described herein any more.

In another aspect of the present disclosure, there is further provided a fabricating method of an array substrate, comprising a step of forming a gate driven circuit in a pixel unit of a first display region and a step of forming a pixel electrode. In the array substrate fabricated by the method in the present embodiment, the array substrate comprises a first display region and a second display region, wherein the first display region is a region where the gate driven circuit is fabricated in the pixel unit, and the second display region is the region other than the first display region; wherein the second display region comprises a first display sub-region and a second display sub-region, and the second display sub-region is located between the first display sub-region and the first display region, and the area of a pixel electrode within the second display sub-region is less than the area of a pixel electrode within the first display sub-region.

When the above-described method is used for fabricating the array substrate in various embodiments described herein, many different forms may be performed, and will not be described herein any more.

In still another aspect of the present disclosure, there is further provided a liquid crystal display device, comprising a light guide plate and an array substrate; wherein the light guide plate is any one of the light guide plates provided in the embodiments described herein; and the array substrate is an one of the array substrates provided in the embodiments described herein.

In the present embodiment, the display device herein may be: e-paper, mobile phone, tablet computer, television, display, notebook computer, digital picture frame, navigator and any other product or component having a display function.

Unless clearly indicated otherwise in the context, the singular forms of words used in the text and appended claims comprise the plural and vice versa. Thus, when referring to the singular form, the plural form of the corresponding terms are generally included. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples" particularly when followed by a listing of terms is merely exemplary and illustrative, and should not be deemed to be exclusive or comprehensive.

The foregoing description of the embodiments has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

What is claimed is:

1. A light guide plate for use in a liquid crystal display device, the liquid crystal display device comprising an array substrate with a gate driving circuit being fabricated in a pixel unit, the light guide plate comprising a light guide plate body and a plurality of net-dots disposed on the light guide plate body, the net-dots characterized by at least one of the following:
   a density of net-dots in a first region of the light guide plate body that is greater than a density of net-dots in a second region of the light guide plate body, wherein the first region corresponds to a first display region of the array substrate which is a region where the gate driving circuit is fabricated in the pixel unit, and wherein the second region corresponds to a second display region of the array substrate which is a region other than the first display region; and,
   a diameter of net-dots in the first region of the light guide plate body is greater than a diameter of net-dots in the second region of the light guide plate body.

2. The light guide plate according to claim 1, wherein the second region comprises a first sub-region and a second sub-region, the second sub-region is located between the first sub-region and the first region, the net-dots further characterized by at least one of the following:
   a density of net-dots within the second sub-region of the light guide plate body is less than a density of net-dots within the first sub-region of the light guide plate body; and
   a diameter of net-dots within the second sub-region of the light guide plate body is less than a diameter of net-dots within the first sub-region of the light guide plate body.

3. The light guide plate according to claim 2, wherein the net-dots are further characterized by at least one of the following:
   the density of net-dots within the second sub-region of the light guide plate body is gradually increased from the first region to the first sub-region; and
   the diameter of net-dots within the second sub-region of the light guide plate body is gradually increased from the first region to the first sub-region.

4. The light guide plate according to claim 1, wherein the diameter of net-dots within the second region of the light guide plate body is between 25 and 35 μm and the diameter of net-dots within the first region of the light guide plate body is between 30 and 50 μm.

5. An array substrate with a gate driving circuit being provided in a pixel unit, the array substrate comprising a first display region and a second display region, wherein the first display region is a region where the gate driving circuit is fabricated in the pixel unit, and the second display region is a region other than the first display region;
   the second display region comprises a first display sub-region and a second display sub-region,
   and the area of a pixel electrode within the second display sub-region adjacent to the first display region and located between the first display sub-region and the first display region is less than the area of a pixel electrode within the first display sub-region.

6. The array substrate according to claim 5, wherein the pixel electrode in the second display sub-region is a plurality of pixel electrodes, and an area of the pixel electrodes within the second display sub-region is gradually increased from the first display region to the first display sub-region.

7. The array substrate according to claim 5, wherein a length of the first display region in a row direction is between 0.8 and 1.2 mm.

8. The array substrate according to claim 7, wherein the length of the first display region in the row direction is between 0.95 and 1.05 mm.

9. A fabricating method of the array substrate according to claim 5, comprising a step of forming the gate driving circuit in the pixel unit of the first display region and a step of forming the pixel electrode.

10. A fabricating method of a light guide plate, the light guide plate being for use in a liquid crystal display device, the liquid crystal display device comprising an array substrate with a gate driving circuit being fabricated in a pixel unit, the method comprising:
    providing a light guide plate body;
    forming a plurality of net-dots on the light guide plate body, the net-dots characterized by at least one of the following:
    a density of net-dots in a first region of the light guide plate body that is greater than a density of net-dots in a second region of the light guide plate body, wherein the first region corresponds to a first display region of the array substrate which is a region where the gate driving circuit is fabricated in the pixel unit, and wherein the second region corresponds to a second display region of the array substrate which is a region other than the first display region; and,
    a diameter of net-dots in the first region of the light guide plate body is greater than a diameter of net-dots in the second region of the light guide plate body.

11. A liquid crystal display device, comprising an array substrate with a gate driving circuit being fabricated in a pixel unit and a light guide plate,
    wherein the array substrate comprises a first display region and a second display region, wherein the first display region is a region where the gate driving circuit is fabricated in the pixel unit, and the second display region is a region other than the first display region;
    the second display region comprises a first display sub-region and a second display sub-region,
    and the area of a pixel electrode within the second display sub-region adjacent to the first display region and located between the first display sub-region and the first display region is less than the area of a pixel electrode within the first display sub-region, and
    wherein the light guide plate comprises a light guide plate body and a plurality of net-dots disposed on the light guide plate body, the net-dots characterized by at least one of the following:
    a density of net-dots in a first region of the light guide plate body that is greater than a density of net-dots in a second region of the light guide plate body, wherein the first region corresponds to a first display region of the array substrate which is a region where the gate driving circuit is fabricated in the pixel unit, and wherein the second region corresponds to a second display region of the array substrate which is a region other than the first display region; and,
    a diameter of net-dots in the first region of the light guide plate body is greater than a diameter of net-dots in the second region of the light guide plate body.

12. The liquid crystal display device according to claim 11, wherein the second region comprises a first sub-region and a second sub-region, the second sub-region is located between the first sub-region and the first region, and the net-dots are further characterized by at least one of the following:

a density of net-dots within the second sub-region of the light guide plate body is less than a density of net-dots within the first sub-region of the light guide plate body; and a diameter of net-dots within the second sub-region of the light guide plate body is less than a diameter of net-dots within the first sub-region of the light guide plate body.

13. The liquid crystal display device according to claim 12, wherein the net-dots are further characterized by at least one of the following:

the density of net-dots within the second sub-region of the light guide plate body is gradually increased from the first region to the first sub-region; and the diameter of net-dots within the second sub-region of the light guide plate body is gradually increased from the first region to the first sub-region.

14. The liquid crystal display device according to claim 11, wherein the diameter of net-dots within the second region of the light guide plate body is between 25 and 35 µm, and the diameter of net-dots within the first region of the light guide plate body is between 30 and 50 µm.

15. The liquid crystal display device according to claim 11, wherein the pixel electrode in the second display sub-region is a plurality of pixel electrodes, and an area of the pixel electrodes within the second display sub-region is gradually increased from the first display region to the first display sub-region.

16. The liquid crystal display device according to claim 11, wherein a length of the first display region in a row direction is between 0.8 and 1.2 mm.

17. The liquid crystal display device according to claim 16, wherein the length of the first display region in the row direction is between 0.95 and 1.05 mm.

18. The liquid crystal display device according to claim 11, wherein a projection of the first region on the array substrate overlaps the first display region of the array substrate, and a projection of the second region on the array substrate overlaps the second display region of the array substrate.

* * * * *

UNITED STATES PATENT AND TRADEMARK OFFICE
CERTIFICATE OF CORRECTION

PATENT NO. : 10,459,153 B2
APPLICATION NO. : 15/227444
DATED : October 29, 2019
INVENTOR(S) : Shanshan Zhou et al.

Page 1 of 1

It is certified that error appears in the above-identified patent and that said Letters Patent is hereby corrected as shown below:

In the Specification

Column 4, Line 17, delete "Embodiment 1" and insert therefor -- Embodiment I --.

Column 4, Line 19, delete "Embodiment 1" and insert therefor -- Embodiment I --.

Column 6, Line 3, delete "first display sub-region BP" and insert therefor -- first display sub-region B1' --.

Column 6, Lines 55-56, delete "first display sub-region BP" and insert therefor -- first display sub-region B1' --.

Signed and Sealed this
Twenty-fourth Day of December, 2019

Andrei Iancu
*Director of the United States Patent and Trademark Office*